US008172942B2

(12) United States Patent
Fukui et al.

(10) Patent No.: US 8,172,942 B2
(45) Date of Patent: May 8, 2012

(54) ARC DISCHARGE APPARATUS, APPARATUS AND METHOD FOR MANUFACTURING VITREOUS SILICA GLASS CRUCIBLE, AND METHOD FOR PULLING UP SILICON SINGLE CRYSTAL

(75) Inventors: Masanori Fukui, Akita (JP); Koichi Suzuki, Akita (JP); Takeshi Fujita, Akita (JP)

(73) Assignees: Japan Super Quartz Corporation, Akita-Ken (JP); Sumco Corporation, Tokyo (JP)

( * ) Notice: Subject to any disclaimer, the term of this patent is extended or adjusted under 35 U.S.C. 154(b) by 799 days.

(21) Appl. No.: 12/253,500

(22) Filed: Oct. 17, 2008

(65) Prior Publication Data

US 2010/0095881 A1  Apr. 22, 2010

(51) Int. Cl.
  C30B 11/00  (2006.01)
  C30B 15/00  (2006.01)
  C30B 21/06  (2006.01)
  C30B 27/02  (2006.01)
  C30B 28/10  (2006.01)
  C30B 30/04  (2006.01)
  C30B 17/00  (2006.01)
  C30B 21/02  (2006.01)
  C30B 28/06  (2006.01)
  C30B 35/00  (2006.01)
(52) U.S. Cl. ............ 117/13; 117/11; 117/73; 117/200; 117/206

(58) Field of Classification Search .................... 117/13, 117/11, 73, 200, 206
See application file for complete search history.

(56) References Cited

U.S. PATENT DOCUMENTS

| 6,363,098 B1 * | 3/2002 | Hagihara et al. ............... 373/88 |
| 6,946,110 B2 * | 9/2005 | Nishimura et al. ......... 423/447.1 |
| 2010/0071417 A1 * | 3/2010 | Kishi et al. ...................... 65/66 |
| 2010/0077611 A1 * | 4/2010 | Fujita et al. ..................... 29/874 |

FOREIGN PATENT DOCUMENTS

| JP | 2000-169845 | 6/2000 |
| JP | 2001-097775 A | 4/2001 |
| JP | 2002-068841 A | 3/2002 |
| JP | 2004-209610 | 7/2004 |

OTHER PUBLICATIONS

English language Abstract of JP 2001-097775 A; Apr. 10, 2001.
English language Abstract of JP 2002-068841 A; Mar. 8, 2002.
U.S. Appl. No. 12/253,370 to Fukui et al., filed on Oct. 17, 2008.
Japan Office action, dated Aug. 18, 2011 along with an english translation thereof.

* cited by examiner

Primary Examiner — James McDonough
(74) Attorney, Agent, or Firm — Greenblum & Bernstein, P.L.C.

(57) ABSTRACT

The arc discharge apparatus comprises a plurality of carbon electrodes connected to respective phases of a power supply for heating a silica powder and causing it to fuse by generating arc discharge between the carbon electrodes. All of the carbon electrodes have a density in a range from 1.30 g/cm$^3$ to 1.80 g/cm$^3$, and variability in density among the carbon electrodes is 0.2 g/cm$^3$ or less. The carbon particles that constitute the carbon electrodes preferably have a particle diameter of 0.3 mm or less.

4 Claims, 1 Drawing Sheet

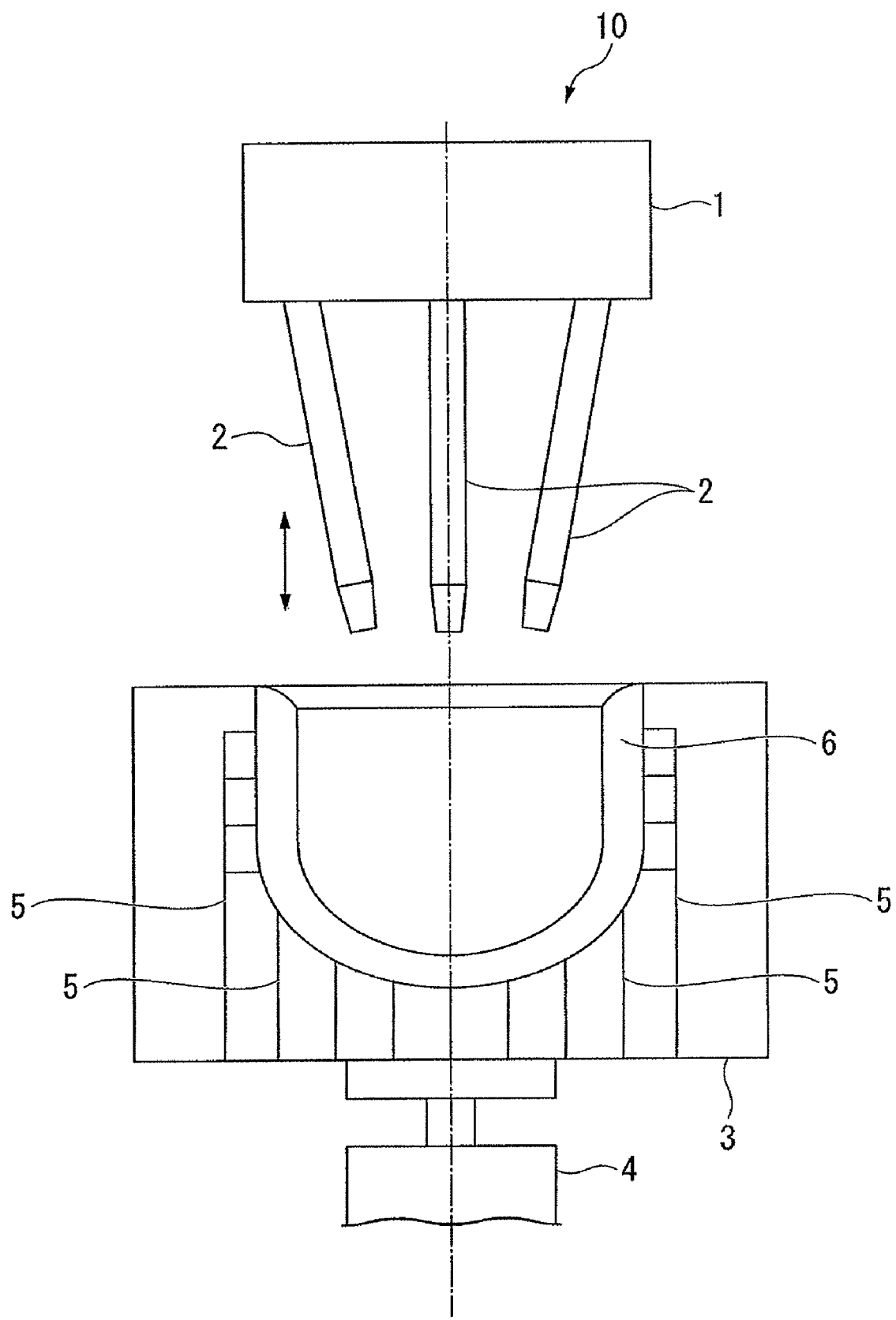

ARC DISCHARGE APPARATUS, APPARATUS AND METHOD FOR MANUFACTURING VITREOUS SILICA GLASS CRUCIBLE, AND METHOD FOR PULLING UP SILICON SINGLE CRYSTAL

BACKGROUND OF THE INVENTION

1. Field of the Invention

The present invention relates to an arc discharge apparatus used to heat a silica powder by arc discharge and cause it to fuse and vitrify, an apparatus comprising the arc discharge apparatus for manufacturing the vitreous silica glass crucible, a method for manufacturing the same and a method for pulling up a silicon single crystal.

2. Description of the Related Art

A vitreous silica glass crucible used in producing a silicon single crystal by pulling up is manufactured mainly by an arc fusing process. With this process, a silica powder is placed as a layer of a predetermined thickness on the inner surface of a mold formed from carbon, generating arc discharge between a plurality of carbon electrodes disposed above the deposited silica layer, and heating the deposited silica layer so as to fuse and vitrify, thereby manufacturing the vitreous silica glass crucible.

With the manufacturing process described above, a part of the silica powder heated to a high temperature melts and gasifies to produce silica fume when the silica powder is fused by the arc. This method has such a problem that the silica fume deposits on the electrode surface and the coagulated silica fume falls into molten fused silica (dropping phenomenon), thus resulting in deposition of a foreign matter on the inner surface of the vitreous silica glass crucible or inhomogeneity of the fused silica.

There is also such a problem that, when a carbon electrode that is not sufficiently homogeneous is used, the arc becomes uneven which may result in chipping of the electrode, thus causing carbon chips that come off the electrode to deposit on the surface of the vitreous silica crucible and undergo incomplete burning, resulting in the production of black foreign matter. Even when the black foreign matter is completely burned, pits are formed on the crucible surface resulting in an undesirable state of the surface. In particular, when the crucible is regenerated, since arc discharge is generated with less power and of a shorter duration than those employed during manufacturing the crucible so as to avoid deformation of the crucible, carbon chips coming off the electrode are more likely to undergo incomplete burning and produce black foreign matter.

Carbon particles that constitute the carbon electrode are gradually consumed as the carbon particles residing on the surface are burned by the arc. Burning carbon particles, when small in size, burn out before reaching the crucible surface. Large carbon particles, however, do not burn out before falling onto the crucible surface, with the remnant turning into black foreign matter or burning on the inner surface of the crucible to form pits on the surface. Such black foreign matter and the irregular inner surface of the crucible decrease the yield of producing the single crystal when pulling up a silicon single crystal.

To solve the problems described above, Patent Document 1 (Japanese Unexamined Patent Publication (Kokai) No. 2001-97775) discloses a carbon electrode formed from carbon particles having a maximum carbon particle diameter of 150 μm or less, an electrode density of 1.80 g/cm$^3$ or more and a strength of 35 MPa or more as measured by a 3-point bending test.

Patent Document 2 (Japanese Unexamined Patent Publication (Kokai) No. 2002-68841) discloses a high-purity carbon electrode for arc fusing application formed from carbon particles having a particle diameter in a range of from 0.05 to 0.5 mm.

The carbon electrode disclosed in Patent Document 1 has such problems that molding extremely small carbon particles into an electrode of high density and high strength is expensive, and that unevenness in density of the electrode makes the arc unstable and may cause chipping of the electrode. Moreover, when the density of the electrode is too high, the carbon particles bond with each other too strongly. As a result, lumps of carbon particles are scattered as the electrode is consumed during arc discharge, and the lumps that fall onto the inner surface of the crucible without burning out may produce black foreign matter and/or pits.

The high-purity carbon electrode disclosed in Patent Document 2, on the other hand, has economical advantages but needs to be improved in terms of the uniformity of electrode density and in terms of particle diameter of the carbon particles.

SUMMARY OF THE INVENTION

An object of the present invention is to solve the problems of conventional carbon electrodes used in arc heating described above and to provide an arc discharge apparatus comprising high-purity carbon electrodes that are economically advantageous and do not have the problems of a black foreign matter and pits formed on the inner surface of a crucible during manufacture and regeneration of a vitreous silica glass crucible. The present invention also provides a vitreous silica glass crucible manufacturing apparatus comprising the arc discharge apparatus, a vitreous silica glass crucible manufactured or regenerated by means of the manufacturing apparatus, and a method for pulling up a silicon single crystal by using the vitreous silica glass crucible.

The present invention relates to an arc discharge apparatus having the constitution described below, an apparatus and a method for manufacturing a vitreous silica glass crucible, and a method for pulling up a silicon single crystal.

(1) The arc discharge apparatus has a plurality of carbon electrodes connected to different phases of a power supply and generates arc discharge between the carbon electrodes to heat and fuse a carbon powder, wherein the carbon electrodes all have a density in a range of from 1.30 g/cm$^3$ to 1.80 g/cm$^3$, and the variability in density among the carbon electrodes is 0.2 g/cm$^3$ or less.

(2) The arc discharge apparatus according to (1), wherein the carbon electrodes are formed from carbon particles having a particle diameter of 0.3 mm or less.

(3) The arc discharge apparatus according to (1), wherein the variability in density among the carbon electrodes electrode is 0.10 g/cm$^3$ or less and the carbon electrodes are formed from carbon particles having a particle diameter of 0.1 mm or less.

(4) A vitreous silica glass crucible manufacturing apparatus comprising the arc discharge apparatus according to any one of (1) to (3).

(5) A vitreous silica glass crucible manufactured by the apparatus according to (4).

(6) A method for pulling up a silicon single crystal using the vitreous silica glass crucible according to (5).

The arc discharge apparatus of the present invention makes it possible to generate a stable arc during arc fusing of a silica powder without causing local chipping of the electrode. Also because carbon particles scattered from the carbon electrode during arc discharge are burned completely, the problem of carbon particles that fall onto the inner surface of the crucible without burning out and producing a black foreign matter and/or pits is eliminated.

Thus the vitreous silica glass crucible manufacturing apparatus equipped with the arc discharge apparatus of the present invention makes it possible to manufacture a vitreous silica glass crucible of high quality, and use of the vitreous silica glass crucible enables achievement of a high yield of single crystal production when pulling up a silicon single crystal.

The term "silica powder" used in this specification is not restricted to the silica powder in the typical sense of the word, and encompasses any known materials used to form vitreous silica glass crucibles, such as silicon dioxide (silica), rock crystal and silica sand. The particles that constitute the silica powder may be either in the state of a single crystal, polycrystalline, amorphous or glass.

BRIEF DESCRIPTION OF THE DRAWINGS

FIG. 1 is a sectional view showing one embodiment of the arc discharge apparatus and the vitreous silica glass crucible manufacturing apparatus according to the present invention.

DETAILED DESCRIPTION OF THE INVENTION

The present invention will be described below in detail by way of embodiments.

FIG. 1 shows one embodiment of the vitreous silica glass crucible manufacturing apparatus according to the present invention, that comprises mainly a mold 3 having a shape of a bottomed cylinder, a drive mechanism 4 that drives the mold 3 to rotate about the axis thereof, and an arc discharge apparatus 10 that heats the inside of the mold 3. The mold 3 is formed from, for example, carbon and has a number of pressure reducing passages 5 that open to the inner surface of the mold. The pressure reducing passages 5 are connected to a pressure reducing mechanism that is not illustrated, so that the inside of the mold 3 can be evacuated through the pressure reducing passages 5 while the mold 3 rotates. A deposited silica layer 6 can be formed on the inner surface of the mold 3 by depositing a silica powder thereon. The deposited silica layer 6 is held onto the inner wall surface by the centrifugal force generated by the rotation of the mold 3. When the deposited silica layer 6 is heated by the arc discharge apparatus 10 while reducing the pressure via the pressure reducing passages 5, the deposited quartz layer 6 is fused so as to form a fused silica glass layer. After cooling, the vitreous silica glass crucible is taken out of the mold 3 and is finished by trimming.

The arc discharge apparatus 10 comprises a plurality of carbon electrodes 2 formed from high-purity carbon in a rod shape, an electrode driving mechanism 1 that holds and moves the carbon electrodes 2, and a power source (not shown) that supplies electric current to each carbon electrode 2. While three carbon electrodes 2 are provided in this example, the number of carbon electrodes may be two, or four or more as long as arc discharge can be generated between the carbon electrodes 2. There is also no restriction on the shape of the carbon electrodes 2. The carbon electrodes 2 are disposed so as to come nearer to each other toward the distal end thereof. While the power may be supplied as either alternating current or direct current, each of the three carbon electrodes 2 is connected to a different phase of a 3-phase alternating current.

The arc discharge apparatus 10 of this embodiment is characterized in that the density of the carbon electrodes 2 is in a range from 1.30 g/cm³ to 1.80 g/cm³ and the difference in density among the carbon electrodes 2 connected to the different phases of power is 0.2 g/cm³ or less.

The carbon electrodes 2 are formed from high-purity carbon particles bonded with each other, with the resultant molding (electrode) having a density of 1.30 g/cm³ or more and 1.80 g/cm³ or less, preferably 1.30 g/cm³ or more and 1.70 g/cm³ or less, and more preferably 1.50 g/cm³ or more and 1.70 g/cm³ or less.

When the density of the molded electrode is less than 1.30 g/cm³, the carbon particles do not bond strongly with each other, and therefore local chipping of the electrode is more likely to occur during arc discharge. A low density also results in a rough surface of the electrode, which may deposit the silica fume that is generated when the silica powder is heated and melted on the electrode surface. The deposited silica may coagulate and fall onto the inner surface of the crucible to form a foreign matter.

On the other hand, when the density of the molded electrode is more than 1.80 g/cm³, the carbon particles bond too strongly with each other, and therefore carbon particles, that have grown larger through coagulation scatter when the burning carbon particles scatter as the electrode is consumed during arc discharge. The large carbon particles tend to fall onto the inner surface of the crucible without burning out, thus producing black foreign matter and/or pits, which is not preferable.

The carbon electrodes 2 are preferably formed from high-purity carbon particles having a particle diameter of 0.3 mm or less, more preferably 0.1 mm or less, and still more preferably 0.05 mm or less. When the particle diameter of the carbon particles is more than 0.3 mm, the carbon particles that scatter while burning as the electrode is consumed during arc discharge tend to fall onto the inner surface of the crucible without burning out, thus producing black foreign matter. Carbon particles larger than the range described above also result in a rough surface of the carbon electrode, which allows the silica fume that is generated when the silica powder is heated to melt and deposit on the electrode surface, which is not preferable.

In the arc discharges of the prior art, carbon electrodes having a density of more than 1.80 g/cm³ were typically used under the presumption that higher density means higher durability. Also because insufficient effort has been made to control the variability in density of the conventional carbon electrodes, variability in density usually has not been decreased to below 0.2 g/cm³.

The carbon electrodes 2 of this embodiment are connected to the respective phases (phase R, phase S, and phase T) of a 3-phase AC power source, so as to generate arc discharge between the carbon electrodes 2. The arc discharge apparatus 10 of this embodiment employs carbon electrodes 2 having a density in a range of from 1.30 g/cm³ to 1.80 g/cm³, with variability in density among the carbon electrodes connected to the respective phases controlled within 0.2 g/cm³. As variability in density among the carbon electrodes is 0.2 g/cm³ or less, high homogeneity is achieved. As a result, a stable arc can be formed between the carbon electrodes 2, so that the electrode surface is less likely to be chipped to cause carbon pieces to fall. When variability in density among the electrodes is more than 0.2 g/cm³, the arc generated between the electrodes becomes unstable, thus making the electrode surface more likely to be chipped.

To manufacture the vitreous silica glass crucible used in pulling up the silicon single crystal, a high-purity carbon electrode is used for the purpose of preventing the crucible from being polluted by metal. To manufacture the carbon electrodes 2 of the present invention, high-purity carbon particles similar to those used in the prior art are used.

The high-purity carbon electrode used in the present invention may be manufactured by, for example, a cold isobaric pressurization (CIP) method. This forming method enables to provide a carbon electrode that has high density and high homogeneity using a fine carbon powder. There is no restriction on the binder that is mixed with the carbon powder, and any material that has been used to manufacture carbon electrodes of this type in the prior art may be used. Specifically, coal tar or the like may be used; the content in the carbon electrode is from 25 to 100% by weight.

While the arc discharge apparatus of the present invention can be used in the vitreous silica glass crucible manufacturing apparatus as in the embodiment described above, it is not limited to this and may be used in any application in which high-purity silica is heated and melted.

The vitreous silica glass crucible of the present invention is manufactured by using the manufacturing apparatus of the present invention, and has less foreign matter originating in the carbon electrode deposited and less pits formed from deposition of the foreign matter on the inner surface of the crucible, thereby making it possible to grow a silicon single crystal of high quality.

With the method of pulling up a silicon single crystal according to the present invention, a polycrystalline silicon is melted in the vitreous silica glass crucible, a seed made of silicon single crystal is dipped in the molten silicon, and the seed is pulled up while rotating the vitreous silica glass crucible, thereby forming an ingot of silicon single crystal. With this method of pulling the silicon single crystal, the molten silicon is generated in a crucible that has less foreign matter originating from the carbon electrode deposited and less pits formed from deposition of the foreign matter on the inner surface thereof, and the single crystal is pulled up therefrom and therefore there is an advantage of being capable of manufacturing a single crystal of high quality.

EXAMPLES

Examples of the present invention will be described below along with Comparative Examples.

Vitreous silica glass crucible manufacturing apparatuses of Examples 1 to 7 and Comparative Examples 1 to 5 were assembled by using carbon electrodes formed from a plurality of kinds of carbon particles having different maximum particle diameters (μm) shown in Table 1. In every apparatus, a 3-phase alternate current was supplied to three electrodes.

The carbon electrode was formed with a circular cross section having a diameter of 5 cm. The mold 3 having an inner diameter of 82 cm and a depth of 70 cm at the center was used. The thickness of the deposited silica layer was set to 4 cm.

The numerical values shown in the columns identified by phase R through phase T in Table 1 are densities ($g/cm^3$) of the carbon electrodes connected to the respective phases. The density difference is given in terms of the difference in density ($g/cm^3$) between the electrode having the highest density and the electrode having the lowest density. The density of the carbon electrode refers to the mean density of each carbon electrode as a whole.

A vitreous silica glass crucible fabricated by arc fusing while rotating the mold in each of the apparatuses was investigated to determine the properties thereof. The numerical values shown in the columns of black foreign matter and pits in Table 1 are the numbers of a black foreign matter and pits, respectively, formed over the area of about 13,500 $cm^2$ of the crucible inner surface.

Furthermore, the vitreous silica glass crucible was used to grow silicon single crystal by pulling up. The percentage of the portion of the silicon single crystal ingot that can be used to make silicon wafers was measured, with the result given as the yield in Table 1. In Table 1, evaluation is described "A" as the ingot of very high yield with substantially free of foreign matter, "B" as the ingot of high yield with little foreign matter, and "C" as ingot of low yield with a lot of foreign matter.

As can be seen from Table 1, a 70% or higher yield of a single crystal was achieved by using the vitreous silica glass crucible made by the apparatuses (Examples 1 to 7) that employed carbon electrodes having a density, variation in density and maximum carbon particle diameter all within the ranges of the present invention. In particular, the use of the apparatuses (Examples 1, 2, 5) that employed carbon electrodes having a variability in density of 0.1 $g/cm^3$ or less and a density of the electrodes of 1.40 $g/cm^3$ or more, led to the yield of single crystal as high as 84%. When the apparatuses that employed carbon electrodes having density variations in a range from 0.2 $g/cm^3$ to 0.15 $g/cm^3$ (Examples 3, 4), the apparatus that employed carbon electrodes having an electrode density of approximately 1.80 $g/cm^3$ (Example 6) and the apparatus that employed carbon electrodes having a density of approximately 1.30 $g/cm^3$ (Example 7) were used, the yield of single crystal was above 70%.

In all of Comparative Examples 1 to 5, in which carbon electrodes having a density, variation in density and maximum carbon particle diameter beyond the ranges of the present invention were used, the yield of a single crystal was significantly lower.

TABLE 1

|  | Carbon electrode | | | | | Properties of vitreous silica crucible | | | |
| --- | --- | --- | --- | --- | --- | --- | --- | --- | --- |
|  | Phase R | Phase S | Phase T | Variation in density | Max. particle diameter | Black foreign matter | Pits | Yield of single crystal | Evaluation |
| Example 1 | 1.53 | 1.50 | 1.48 | 0.05 | 0.05 | 0.0 | 0.0 | 84% | A |
| Example 2 | 1.57 | 1.51 | 1.47 | 0.10 | 0.05 | 0.3 | 0.4 | 84% | A |
| Example 3 | 1.57 | 1.50 | 1.42 | 0.15 | 0.06 | 0.7 | 5.6 | 77% | B |
| Example 4 | 1.64 | 1.51 | 1.44 | 0.20 | 0.10 | 1.6 | 11.3 | 72% | B |
| Example 5 | 1.53 | 1.50 | 1.48 | 0.05 | 0.04 | 0.0 | 0.0 | 84% | A |
| Example 6 | 1.74 | 1.75 | 1.72 | 0.03 | 0.05 | 0.3 | 17.1 | 75% | B |
| Example 7 | 1.30 | 1.31 | 1.31 | 0.01 | 0.24 | 0.8 | 19.0 | 70% | B |
| Comparative Example 1 | 1.63 | 1.50 | 1.39 | 0.24 | 0.05 | 7.2 | 37.0 | 34% | C |

TABLE 1-continued

|  | Carbon electrode | | | | | Properties of vitreous silica crucible | | | |
| --- | --- | --- | --- | --- | --- | --- | --- | --- | --- |
|  | Phase R | Phase S | Phase T | Variation in density | Max. particle diameter | Black foreign matter | Pits | Yield of single crystal | Evaluation |
| Comparative Example 2 | 1.64 | 1.50 | 1.34 | 0.30 | 0.13 | 10.1 | 100< | 25% | C |
| Comparative Example 3 | 1.88 | 1.87 | 1.90 | 0.03 | 0.05 | 12.4 | 100< | 20% | C |
| Comparative Example 4 | 1.26 | 1.25 | 1.28 | 0.02 | 0.03 | 7.7 | 86.0 | 33% | C |
| Comparative Example 5 | 1.53 | 1.50 | 1.48 | 0.05 | 0.5 | 11.6 | 100< | 31% | C |

Note:
The numerical values for the black foreign matter and pits are the numbers thereof formed on the crucible inner surface.
Density is in g/cm$^3$, and max. particle diameter is in μm.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description but is only limited by the scope of the appended claims.

What is claimed is:

1. An arc discharge apparatus having a plurality of carbon electrodes connected to respective phases of a power supply for heating a silica powder and causing it to fuse by generating arc discharge between the carbon electrodes, wherein all of the carbon electrodes have a density in a range of from 1.30 g/cm$^3$ to 1.57 g/cm$^3$, and variability in density among the carbon electrodes of 0.2 g/cm$^3$ or less.

2. The arc discharge apparatus according to claim 1, wherein the carbon electrodes are formed from carbon particles having a particle diameter of 0.3 mm or less.

3. The arc discharge apparatus according to claim 1, wherein the variability in density among the carbon electrodes is 0.10 g/cm$^3$ or less and the carbon particles constituting the carbon electrodes have a particle diameter of 0.1 mm or less.

4. A vitreous silica glass crucible manufacturing apparatus comprising the arc discharge apparatus according to claim 1 and a mold that holds the silica powder.

* * * * *